United States Patent [19]
Fukiharu

[11] Patent Number: 6,075,307
[45] Date of Patent: Jun. 13, 2000

[54] SURFACE ACOUSTIC WAVE SYSTEM

[75] Inventor: Eiichi Fukiharu, Tokyo, Japan

[73] Assignee: NEC Corporation, Tokyo, Japan

[21] Appl. No.: 09/015,827

[22] Filed: Jan. 29, 1998

[30] Foreign Application Priority Data

Jan. 31, 1997 [JP] Japan .................................. 9-017988

[51] Int. Cl.⁷ .................................................. H03H 9/72
[52] U.S. Cl. ...................................... 310/313 R; 310/348
[58] Field of Search ................................ 310/348, 313 R

[56] References Cited

U.S. PATENT DOCUMENTS

| | | | |
|---|---|---|---|
| 3,766,496 | 10/1973 | Whitehouse | 331/107 A |
| 3,940,685 | 2/1976 | Ebata | 323/23 |
| 4,193,045 | 3/1980 | Houkawa et al. | 331/107 A |
| 4,480,148 | 10/1984 | Archer | 174/51 |
| 4,647,881 | 3/1987 | Mitsutsuka | 333/194 |
| 4,733,122 | 3/1988 | Shinonaga et al. | 310/313 R |
| 4,931,752 | 6/1990 | Bray et al. | 333/151 |
| 5,325,573 | 7/1994 | Miyashita et al. | 29/25.35 |
| 5,471,178 | 11/1995 | Hickernell | 333/193 |

FOREIGN PATENT DOCUMENTS

| | | | |
|---|---|---|---|
| 59-43826 | 10/1984 | Japan | H01L 25/02 |
| 61-42943 | 3/1986 | Japan | H01L 25/04 |
| 3-14823 | 2/1991 | Japan | H03H 9/25 |
| 3-72708 | 3/1991 | Japan | H03H 9/25 |

*Primary Examiner*—Thomas M. Dougherty
*Attorney, Agent, or Firm*—Scully, Scott Murphy & Presser

[57] ABSTRACT

A surface acoustic wave system having a mounting receptacle on which there are mounted a plurality of surface acoustic wave elements being bonded together by sides of their surface acoustic wave substrates so as to form a single element assembly. With this structure, a plurality of surface acoustic wave elements can be treated as one surface acoustic wave element in the mounting process, and so less problem is taken in the mounting process. For there is no need for saving a space between two neighboring surface acoustic wave elements for the mounting process, the mounting density can be increased. Further, it is possible to bond together the surface acoustic wave elements having different surface acoustic wave substrates and treat the bonded elements as one element, which provides more flexibility to the system design.

7 Claims, 5 Drawing Sheets

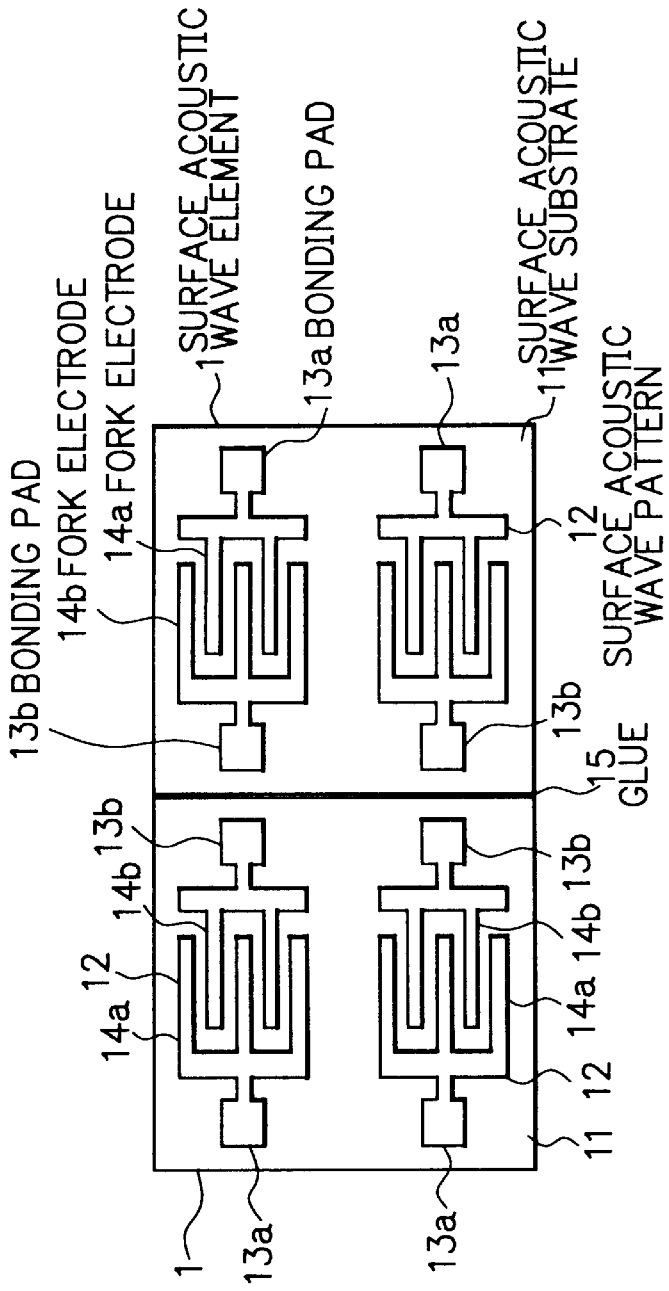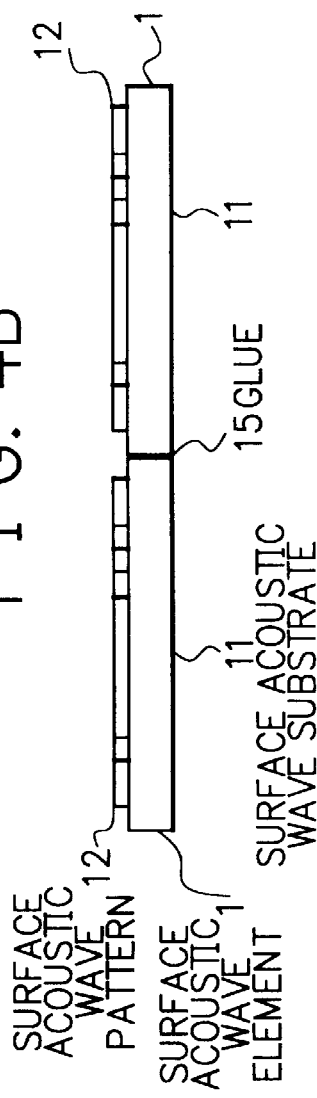

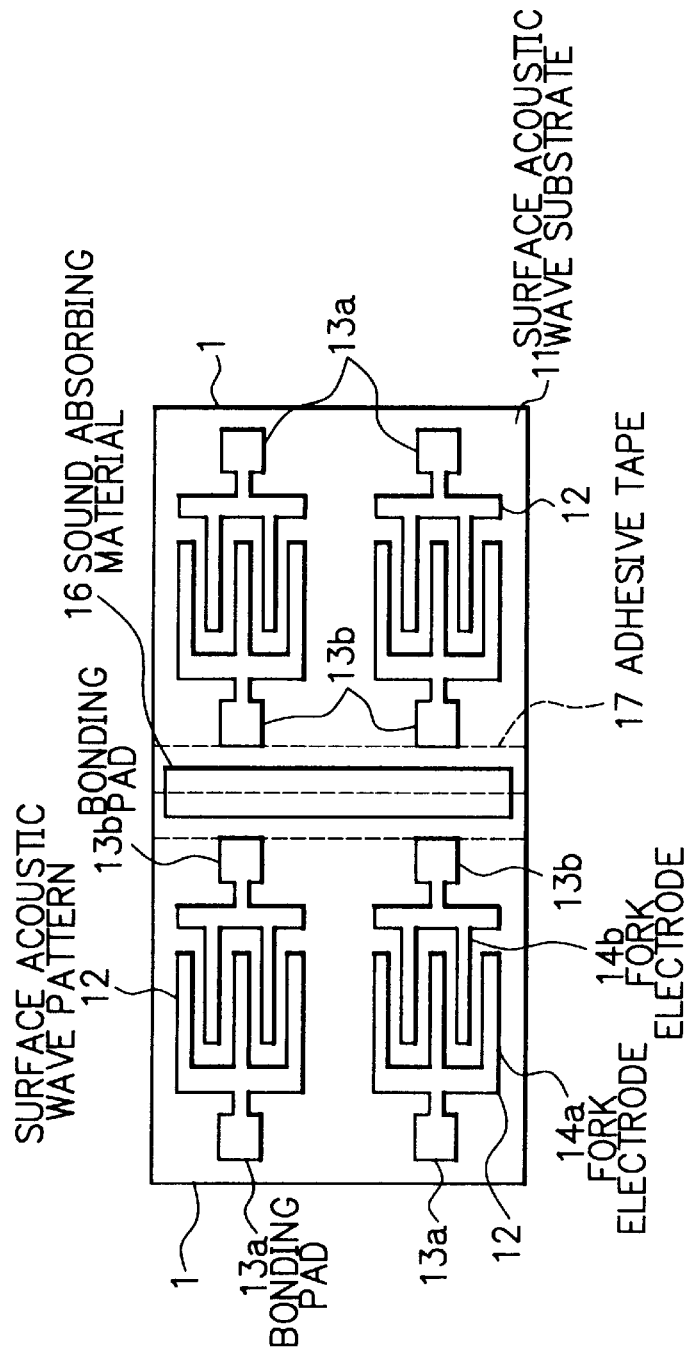
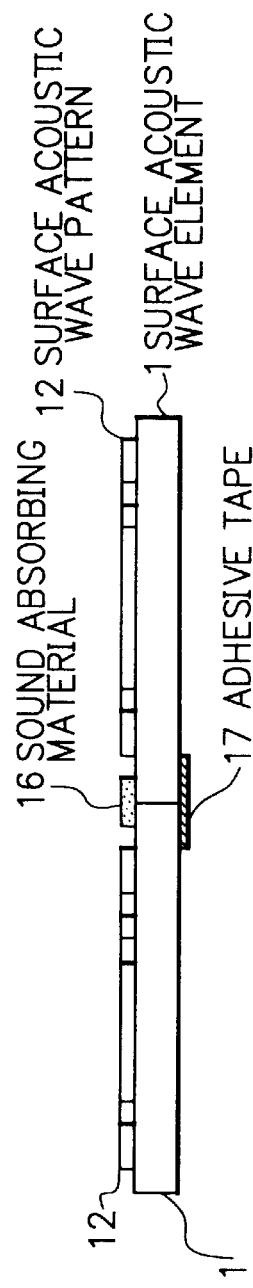
FIG. 5A
FIG. 5B

SURFACE ACOUSTIC WAVE SYSTEM

BACKGROUND OF THE INVENTION

The present invention relates to a surface acoustic wave system, especially to that having a plurality of surface acoustic wave elements mounted on the same receptacle.

DESCRIPTION OF THE RELATED ART

Conventionally, a typical surface acoustic wave system would have a surface acoustic wave element mounted on a mounting receptacle, the surface acoustic wave element having a surface acoustic wave substrate on which there are formed surface acoustic wave patterns. As to the surface acoustic wave patterns, they obtain electric connection through electric wires and the like. With respect to this particular mounting structure of the surface acoustic wave element, for instance, the one disclosed in Japanese Patent Laid-Open Publication No. 3-72708 illustrated in FIG. 1 is common. In such conventional surface acoustic wave system, a single surface acoustic wave element 1 is mounted on a substrate 31 where there are provided input/output patterns 32 and an earth pattern 33 obtaining electric connection through bonding wires 34. Being provided the above conditions, the substrate 31 is covered with a cap 35 having hermetic structure. Therefore, when a plurality of surface acoustic wave elements are to be mounted, a number of substrates and caps as many as the surface acoustic wave elements should be provided in mounting the surface acoustic wave elements. Moreover, there has been a proposal for a surface acoustic wave system in which a plurality of surface acoustic wave elements are mounted on a single mounting receptacle. In this case, however, the surface acoustic wave elements are individually mounted on the mounting receptacle. Further, regarding the same case in which a plurality of surface acoustic wave elements are to be mounted on the mounting receptacle, there has been proposed a structure in which a plurality of surface acoustic wave element patterns are integrated into one body on a single surface acoustic wave substrate.

In case when a plurality of surface acoustic wave elements are to be mounted on a single mounting receptacle, it is obvious that a process of mounting would become easier as a plurality of surface acoustic wave elements are mounted as one body on a single surface acoustic wave substrate. Practically, a single surface acoustic wave element assembly is to be mounted on a single acoustic wave element substrate which makes the mounting easier than in the case where the surface acoustic wave elements are mounted individually. In this case, however, for there is one surface acoustic wave substrate provided for a plurality of surface acoustic wave elements, the material of the substrate is naturally limited to one kind of piezo-electric material. Thus, a design flexibility is limited to a narrower scope which leads to a difficulty in acquiring a surface acoustic wave system of an arbitrary characteristic. On the contrary, as to the structure in which the surface acoustic wave elements are mounted individually, the above-mentioned problem would not occur. However, the mounting process has to be done for a certain number of times which results in a deteriorating the workability.

On the other hand, in mounting a plurality of surface acoustic wave elements on a single mounting receptacle, a structure illustrated in FIG. 2 is taken. According to FIG. 2, two surface acoustic wave elements 1 are mounted on a mounting receptacle 2 with a required space A provided in between them. Around the two of the mounted surface acoustic wave elements, there is provided a seaming 23. Bonding pads 21 provided on the mounting receptacle 2 and bonding pads 13a and 13b within surface acoustic wave patterns 12 of the surface acoustic wave elements are electrically connected through bonding wires 22. In this particular structure, the aforementioned space A is required in between two adjacent surface acoustic wave elements 1 so that the tools used in mounting one surface acoustic wave element would not touch or interfere with the other formerly mounted element. Accordingly, the mounting density within the mounting receptacle 2 is lowered, and so it would be difficult to attempt to miniaturize the scale of the surface acoustic wave system.

SUMMARY OF THE INVENTION

It is therefore the object of the present invention to provide a surface acoustic wave system capable of improving the mounting process and increasing the design flexibility as well as the mounting density.

According to the present invention, there is provided a surface acoustic wave system having a single mounting receptacle on which there are mounted a plurality of surface acoustic wave elements bonded together by the sides of their surface acoustic wave substrates. That is, a plurality of surface acoustic wave elements to be bonded together as one are adhered to one another by the sides of their surface acoustic wave substrates by the use of a glue. Or a plurality of surface acoustic wave elements to be bonded together as one are adhered to one another by the sides of their surface acoustic wave substrates, where there is provided a coating of a sound absorbing material on the upper surface of the bonding region and adhered an adhesive tape on the reverse side of the bonding region.

The above and further objects and the novel feature of the invention will more fully appear from the following detailed description when the same is read in connection with the accompanying drawings. It is to be expressly understood, however, that the drawings are for illustration only and are not intended as a definition of the limits of the invention.

BRIEF DESCRIPTION OF THE DRAWINGS

FIG. 4A is a plan view of the surface acoustic wave elements illustrated in FIG. 3;

FIG. 4B is a front view of the surface acoustic wave elements illustrated in FIG. 3;

FIG. 5A is a plan view of the surface acoustic wave elements of a second embodiment of the present invention; and FIG. 5B is a front view of the surface acoustic wave elements of the second embodiment of the present invention.

DESCRIPTION OF THE PREFERRED EMBODIMENTS

Figure 1:
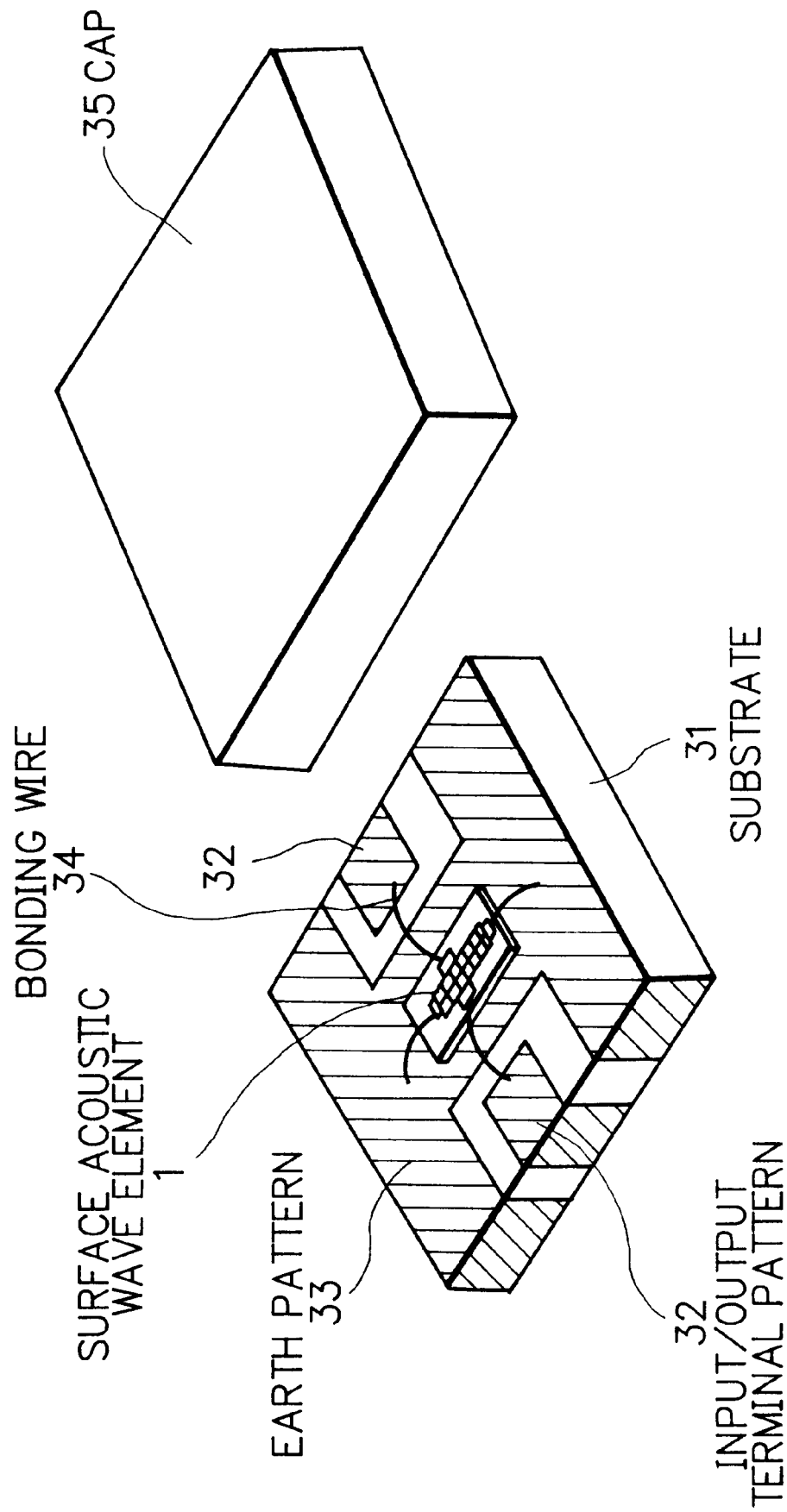
FIG. 1 is a diagram illustrating the structure of the conventional surface acoustic wave system of a single mounting type.
Figure 2:
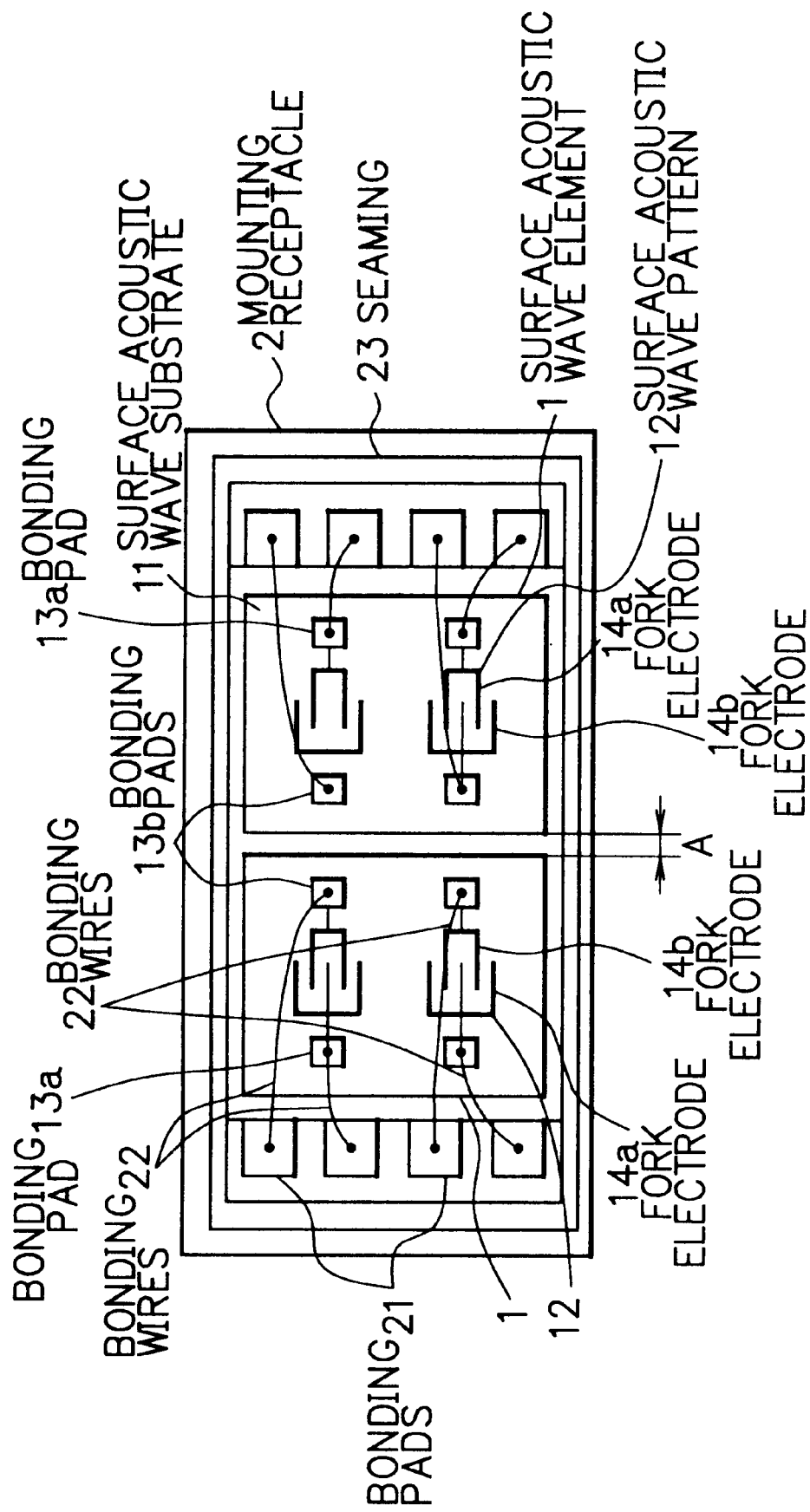
FIG. 2 is a diagram illustrating the structure of the conventional surface acoustic wave system of a plural mounting type.

Referring now to the drawings, a description of preferred embodiments of the present invention will be given in detail.

Figure 3:
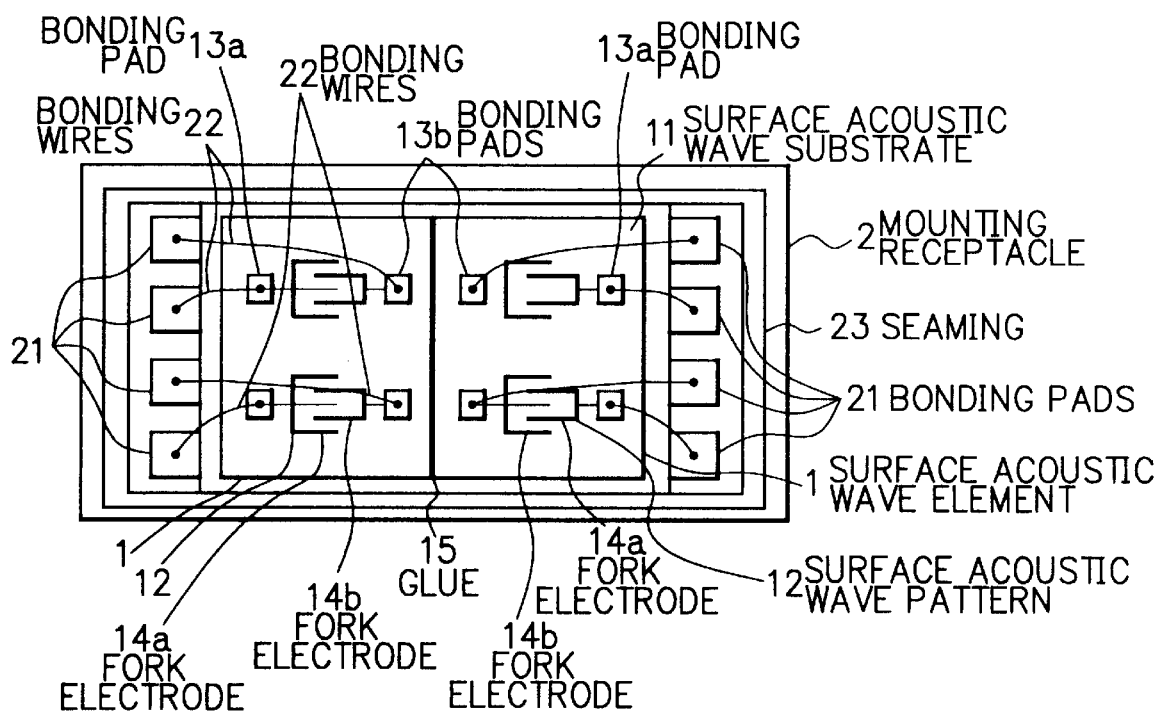
FIG. 3 is a plan view showing an internal structure of the surface acoustic wave system of a first embodiment of the present invention.

FIG. 3 is a plan view showing an internal structure of the surface acoustic wave system according to a first embodiment of the present invention. FIG. 4A is plan view and FIG. 4B is a front view of the mounted surface acoustic wave elements. In those figures, each of the two surface acoustic wave elements 1 is constructed by having surface acoustic wave patterns 12 formed on the surface of a surface acoustic wave substrate 11. The surface acoustic wave patterns 12 formed on the surface acoustic wave substrates 11 are metallic thin films of aluminum or the like being shaped in certain patterns. The surface acoustic wave substrates 11 for the two surface acoustic wave elements are individually made of piezo-electric materials such as lithium niobate, lithium tantalate, crystal, lithium tetraborate and so forth. One surface acoustic wave pattern 12 has bonding pads 13a and 13b paired with fork electrodes 14a and 14b respectively. The bonding pads 13a and 13b are for obtaining electric connection with the mounting receptacle, and the fork electrodes 14a and 14b are for exciting the surface acoustic waves.

When mounting the surface acoustic wave elements 1 on the rectangular mounting receptacle 2, sides of the neighboring surface acoustic wave substrates facing each other are bonded together by a glue 15 so as to form a single body of surface acoustic wave element. Under such conditions, the surface acoustic wave element assembly is mounted on the mounting receptacle 2 where bonding pads 21 are electrically connected to the bonding pads 13a and 13b of the surface acoustic wave patterns, through bonding wires 22. Furthermore, there is provided a seaming 23 around the mounted surface acoustic wave elements 1.

In such manner, two surface acoustic wave elements 1 are bonded together as one by the glue 15 to be mounted on the mounting receptacle 2. Therefore, the mounting process is substantially the same as that for mounting one surface acoustic wave element which indicates that the mounting process can be simplified. Moreover, although the surface acoustic wave elements are glued together, each of them can have a separate surface acoustic wave substrate of different piezo-electric material. Thus, no restriction is imposed on the system design which provides further flexibility for the system design. Furthermore, the space between the two surface acoustic wave elements is as little as that of the thickness generated by the glue, indicating that no useless space is generated in between the surface acoustic wave elements. The mounting density can be improved owing to the application of such structure. Not to mention, as the two surface acoustic wave elements are glued together to become as one body, there is no need for a space in between two surface acoustic wave elements which is originally meant for avoiding interference of tools when mounting is to be done individually.

Now the operation of the surface acoustic wave system according to the first embodiment will be described. From the bonding pad 21 of the mounting receptacle 2, an input signal inputted to an external input terminal of the surface acoustic wave system is transmitted to the bonding pad 13a of the surface acoustic wave pattern 12 through the bonding wire 22. Then at the fork electrode 14a, the signal is to be converted into a surface acoustic wave complying with a certain pattern. This surface acoustic wave reaches the fork electrode 14b facing against the fork electrode 14a to be converted into an electric signal that corresponds to a certain pattern form. Then from the bonding pad 13b of the surface acoustic wave pattern, the electric signal is to be transmitted to another bonding pad 21 of the mounting receptacle 2 through the bonding wire 22 to be outputted from an external output terminal of the surface acoustic wave system.

FIG. 5A is a plan view and FIG. 5B is a front view of the surface acoustic wave element of a second embodiment of the present invention. As to the parts corresponding to those of the surface acoustic wave elements indicated in FIG. 4A and FIG. 4B, the same reference numerals are given. Each of the two surface acoustic wave elements 1 has a separate surface acoustic wave substrate 11 made of a different piezo-electric material where there are formed surface acoustic wave patterns 12 each of which being a metallic thin film such as aluminum formed in a certain pattern. The surface acoustic wave pattern 12 comprises bonding pads 13a and 13b for obtaining electric connection with the mounting receptacle, and fork electrodes 14a and 14b for exciting the surface acoustic wave. Being provided the above conditions, one surface acoustic wave element 1 is to have the side of its surface acoustic wave substrate bonded together with the side of the surface acoustic wave substrate of the neighboring surface acoustic wave element 1. On the upper surface of the bonding region where the two surface acoustic wave elements are connected, there is provided a coating of a sound absorbing material 16 of a silicon type. On the reverse side of this bonding region, there is attached a wide adhesive tape 17. Owing to such structure, the surface acoustic wave elements 1 are bonded together by the sides of their surface acoustic wave substrates 11, to become as one body.

In this embodiment too, the surface acoustic wave elements 1 are bonded together to become a single surface acoustic wave element assembly, and this element assembly is mounted on the mounting receptacle in the same manner shown in FIG. 3. Then the bonding pads of the mounting receptacle are to be electrically connected to the bonding pads of the surface acoustic wave patterns through the bonding wires. The operation of the surface acoustic wave system of the second embodiment is practically the same as that of the first embodiment.

According to the second embodiment, provided that two surface acoustic wave elements are bonded together to become a single element assembly by the application of the sound absorbing material 16 and the adhesive tape 17, the element assembly is mounted on the mounting receptacle. Therefore, the mounting process can be simplified for it is substantially the same as that for mounting a single surface acoustic wave element. Moreover, although the surface acoustic wave elements are bonded together, each of them can have a separate surface acoustic wave substrate of different piezo-electric material. Thus, no restriction is imposed on the system design which provides further flexibility for the system design. Furthermore, for the surface acoustic wave elements bonded together as a single element assembly are closely connected to each other, there is no need for even a glue like in the case of the first embodiment. Therefore, there is practically no space saved in between the surface acoustic wave elements which leads to an advantage that the mounting density can be increased. Not to mention, as the two surface acoustic wave elements are bonded together as a single element assembly, there is no need for a space in between two surface acoustic wave elements which is originally meant for avoiding interference of tools when mounting is to be done individually. In the present embodiment, shocks generating at the bonding region of the two surface acoustic wave elements are absorbed by the sound absorbing material, and so there is no influence whatsoever given to the surface acoustic wave. Furthermore, as to the sound absorbing material, there can be used a glue which will provide the same sort of effect.

As being described above, the present invention takes the structure in which a plurality of surface acoustic wave elements are bonded together as a single element assembly by the sides of their surface acoustic wave substrates to be mounted on the mounting receptacle. Consequently, a plurality of surface acoustic wave elements can practically be treated as one surface acoustic wave element concerning the mounting process, resulting in easier mounting and less trouble in mounting the surface acoustic wave elements. Moreover, there is no need for provision of spaces among a plurality of surface acoustic wave elements which makes it possible to increase the mounting density and so miniaturize the surface acoustic wave system. Furthermore, the surface acoustic wave elements having surface acoustic wave substrates made of different piezo-electric materials can also be bonded together to form a single element assembly, so as to be treated as a single surface acoustic wave element. Thus, the system design can become more flexible.

While preferred embodiments of the invention have been described using specific terms, such description is for illustrative purposes only, and it is to be understood that changes and variations may be made without departing from the spirit or the scope of the following claims.

What is claimed is:

1. A surface acoustic wave system having a single mounting receptacle where there are mounted a plurality of individually constructed surface acoustic wave elements each of them having surface acoustic wave patterns formed on a surface of its surface acoustic wave substrate, each of the surface acoustic wave substrates of a plurality of surface acoustic wave elements being bonded together by its side with a side of a surface acoustic wave substrate of a neighboring surface acoustic wave element, so as to form a single element assembly of surface acoustic wave elements.

2. A surface acoustic wave system according to claim 1 wherein:

a plurality of surface acoustic wave elements to be bonded together as a single element assembly are adhered to one another by sides of their surface acoustic wave substrates with the application of a glue.

3. A surface acoustic wave system according to claim 1 wherein:

a plurality of surface acoustic wave elements to be bonded together as a single element assembly are adhered to one another by sides of their surface acoustic wave substrates, an upper surface of a bonding region of two surface acoustic elements having provided with a coating of surface acoustic wave sound absorbing material, and a reverse side of a bonding region of two surface acoustic elements having adhered thereto an adhesive tape.

4. A surface acoustic wave system according to claim 1 wherein:

each of the surface acoustic wave substrates of a plurality of surface acoustic wave elements is made of one of the four piezo-electric materials, lithium niobate, lithium tantalate, crystal or lithium tetraborate.

5. A surface acoustic wave system according to claim 3 wherein:

each of the surface acoustic wave substrates of a plurality of surface acoustic wave elements is made of one of the four piezo-electric materials, lithium niobate, lithium tantalate, crystal or lithium tetraborate.

6. A surface acoustic wave system according to claim 4 wherein:

each of the surface acoustic wave substrates to be bonded together as one is made of different piezo-electric material.

7. A surface acoustic wave system according to claim 5 wherein:

each of the surface acoustic wave substrates to be bonded together as one is made of different piezo-electric material.

* * * * *